(12) United States Patent
Mulfinger et al.

(10) Patent No.: US 10,043,893 B1
(45) Date of Patent: Aug. 7, 2018

(54) POST GATE SILICON GERMANIUM CHANNEL CONDENSATION AND METHOD FOR PRODUCING THE SAME

(71) Applicant: GLOBALFOUNDRIES Inc., Grand Cayman (KY)

(72) Inventors: George Robert Mulfinger, Gansevoort, NY (US); Ryan Sporer, Mechanicville, NY (US); Timothy J. McArdle, Ballston Lake, NY (US); Judson Robert Holt, Balston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/668,012

(22) Filed: Aug. 3, 2017

(51) Int. Cl.
| | | |
|---|---|---|
| *H01L 29/94* | (2006.01) |
| *H01L 29/66* | (2006.01) |
| *H01L 21/84* | (2006.01) |
| *H01L 21/225* | (2006.01) |
| *H01L 21/02* | (2006.01) |
| *H01L 29/08* | (2006.01) |
| *H01L 29/78* | (2006.01) |
| *H01L 29/10* | (2006.01) |
| *H01L 27/12* | (2006.01) |

(52) U.S. Cl.
CPC .. *H01L 29/66803* (2013.01); *H01L 21/02236* (2013.01); *H01L 21/02255* (2013.01); *H01L 21/2254* (2013.01); *H01L 21/845* (2013.01); *H01L 27/1203* (2013.01); *H01L 29/0847* (2013.01); *H01L 29/1045* (2013.01); *H01L 29/785* (2013.01); *H01L 27/1211* (2013.01)

(58) Field of Classification Search
CPC ......... H01L 29/66803; H01L 21/02236; H01L 21/02255; H01L 21/2254; H01L 21/845; H01L 27/1203
USPC ...................................................... 257/369
See application file for complete search history.

(56) References Cited

U.S. PATENT DOCUMENTS

| | | | |
|---|---|---|---|
| 8,211,761 B2 | 7/2012 | Tan et al. | |
| 9,196,710 B2* | 11/2015 | Wei ..................... | H01L 29/6681 |
| 9,466,723 B1* | 10/2016 | Huang .............. | H01L 21/76897 |
| 2005/0285192 A1 | 12/2005 | Zhu | |
| 2011/0024804 A1 | 2/2011 | Chang et al. | |
| 2011/0068401 A1* | 3/2011 | Izumida .......... | H01L 21/823431 257/347 |

(Continued)

*Primary Examiner* — Ori Nadav
(74) *Attorney, Agent, or Firm* — Ditthavong & Steiner, P.C.

(57) ABSTRACT

Methods of forming a graded SiGe percentage PFET channel in a FinFET or FDSOI device by post gate thermal condensation and oxidation of a high Ge percentage channel layer and the resulting devices are provided. Embodiments include forming a gate dielectric layer over a plurality of Si fins formed over a substrate; forming a gate over each fin; forming a HM and spacer layer over and on sidewalls of each gate; forming a u-shaped cavity in each fin adjacent to the gate and spacer layer; epitaxially growing an un-doped high percentage SiGe layer in each u-shaped cavity and along sidewalls of each fin; thermally condensing the high percentage SiGe layer, an un-doped low percentage SiGe formed underneath in the substrate and fins; and forming a S/D region over the high percentage SiGe layer in each u-shaped cavity, an upper surface of the S/D regions below the gate dielectric layer.

5 Claims, 8 Drawing Sheets

(56) References Cited

U.S. PATENT DOCUMENTS

2016/0141417 A1\* 5/2016 Park ................. H01L 29/66545
257/365
2017/0033219 A1 2/2017 He et al.

\* cited by examiner

POST GATE SILICON GERMANIUM CHANNEL CONDENSATION AND METHOD FOR PRODUCING THE SAME

TECHNICAL FIELD

The present disclosure relates to the manufacture of silicon germanium (SiGe) fin field effect transistor (FinFET) semiconductor devices. The present disclosure is particularly applicable to the 14 nanometer (nm) technology node and beyond.

BACKGROUND

SiGe provides higher carrier mobility than silicon (Si). SiGe fins of a FinFET reduce threshold voltage ($V_t$), thereby increasing the drive current that flows through the channel. However, an effective channel length (Leff) performance improvement with SiGe fins is difficult to achieve because of (i) relaxation of the SiGe fins from tunnel junction (TJ) etching; (ii) interface problems with gate oxide resulting in degrading of the roughness of the fins; (iii) p-type field effect transistor (PFET) gate-induced drain leakage (GIDL); (iv) density of interface trap (DIT); and (v) n-type field effect transistor (NFET) issues associated with the integration process to make SiGe fins, e.g., the nitride liner causing NFET leakage. In addition, yield is difficult to demonstrate with SiGe fins because of high static random access memory (SRAM) leakage and SiGe fin integration limitations, e.g., low temperature STI processing and crystalline defects.

A need therefore exists for methodology enabling forming a SiGe PFET channel without known complicated processing or difficulties.

SUMMARY

An aspect of the present disclosure is a method for forming a graded SiGe percentage PFET channel in a FinFET or fully depleted silicon-on-insulator (FDSOI) device by post gate thermal condensation and oxidation of a high germanium (Ge) percentage channel layer.

Another aspect of the present disclosure is a FinFET or FDSOI device having a graded SiGe percentage PFET channel.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a plurality of Si fins over a Si substrate; forming a gate dielectric layer over the plurality of Si fins; forming a gate over each Si fin of the plurality; forming a hard mask (HM) and spacer layer over and on sidewalls of each gate; forming a u-shaped cavity in Si fins of the plurality adjacent to the gate and spacer layer; epitaxially growing an un-doped high percentage SiGe layer in each u-shaped cavity and along sidewalls of each Si fin; thermally condensing the un-doped high percentage SiGe layer, an un-doped low percentage SiGe formed underneath in the substrate and Si fins; and forming a source/drain (S/D) region over the un-doped high percentage SiGe layer in each u-shaped cavity, an upper surface of the S/D regions below the gate dielectric layer.

Aspects of the present disclosure include the un-doped high percentage SiGe layer including 20 to 50 percent Ge. Further aspects include the un-doped low percentage SiGe layer including 5 to 20 percent Ge. Another aspect includes removing an oxide layer formed by the thermally condensing of the un-doped high percentage SiGe layer. Additional aspects include forming the S/D region of B doped SiGe.

Another aspect of the present disclosure is a device including: a plurality of un-doped low percentage SiGe fins over a Si substrate having a u-shaped un-doped low percentage SiGe layer therebetween; an un-doped high percentage SiGe layer over the u-shaped un-doped low percentage SiGe layer and along sidewalls of the un-doped low percentage SiGe fins; a S/D region over the un-doped high percentage SiGe layer, an upper surface of the S/D region coplanar with an upper surface of the un-doped low percentage SiGe fins; a gate dielectric layer over each un-doped low percentage SiGe fin; a gate over the gate dielectric layer; and a HM and spacer layer over and on opposite sidewalls of each gate.

Aspects of the device include the un-doped low percentage SiGe fins including 5 to 20 percent Ge. Another aspect includes the un-doped low percentage SiGe layer fully extending across the channel region of a short channel device and partially extending beneath channel region of a long channel device. Other aspects include the un-doped high percentage SiGe layer including 20 to 50 percent Ge. A further aspect includes the un-doped high percentage SiGe layer having a thickness of 4.5 nm to 20 nm.

A further aspect of the present disclosure is a method including: providing a buried oxide (BOX) layer over a Si substrate having a NFET region and a PFET region; providing a Si SOI layer over the BOX layer; forming a shallow trench isolation (STI) pillar through the Si SOI and BOX layers and a portion of the substrate between the NFET and PFET regions; forming a gate stack and a first HM over each of the NFET and PFET regions; forming a second HM over the Si SOI layer over the NFET region and along sidewalls of the gate stack and the first HM over the PFET region; epitaxially growing an un-doped high percentage SiGe layer over the Si SOI layer over the PFET region; thermally condensing the un-doped high percentage SiGe layer, converting the Si SOI layer over the PFET region to an un-doped high percentage SiGe layer and an un-doped low percentage SiGe formed underneath the second HM and a portion of the gate stack; and growing a boron (B) doped SiGe S/D region over the un-doped high percentage SiGe layer over the PFET region.

Aspects of the present disclosure include converting the Si SOI layer over the PFET region by: pushing Ge into the Si SOI layer; and removing an oxide layer formed by the thermally condensing of the un-doped high percentage SiGe layer. Further aspects include forming the Si SOI layer to a thickness of 5 nm to 10 nm. Another aspect includes forming each gate stack by: forming a hafnium oxide ($HfO_2$) dielectric layer over the Si SOI layer over the NFET and PFET regions; forming a titanium nitride (TiN) work function (WF) metal layer over the $HfO_2$ dielectric layer; and forming a polysilicon layer over the TiN WF metal layer. Additional aspects include forming the HM by: forming the HM over the substrate; and removing the HM over the Si SOI layer and the first HM over the PFET region, the HM along the sidewalls of the first HM and gate stack remaining. Further aspects include the un-doped high percentage SiGe layer including 20 to 50 percent Ge. Additional aspects include the un-doped low percentage SiGe layer including 5 to 20 percent Ge.

A further aspect of the present disclosure is a device including: a BOX layer over a Si substrate having an NFET region and a PFET region; a Si SOI layer over the BOX layer over the NFET region; a STI pillar through the Si SOI and BOX layers and a portion of the Si substrate between the NFET and PFET regions; an un-doped high percentage and un-doped low percentage SiGe layer over portions of the BOX layer over the PFET region; a gate stack over each of the NFET and PFET regions; and a B doped SiGe S/D on opposite sides of the gate stack over the un-doped high percentage SiGe layer.

Aspects of the present disclosure include the Si SOI layer over the NFET region and the un-doped high percentage SiGe layer over the PFET region having a thickness of 5 nm to 10 nm. Another aspect includes the un-doped high percentage and un-doped low percentage SiGe layer including 20 to 50 percent and 5 to 20 percent Ge, respectively.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of Leff performance and yield for SiGe fins attendant upon post gate SiGe channel condensation. The problems are solved, inter alia, by forming a graded SiGe percentage PFET channel in a FinFET or FDSOI device by post gate thermal condensation and oxidation of a high Ge percentage channel layer to prevent SiGe stacking faults, enable a standard high temperature STI process and a standard fin reveal process, and to avoid crystalline defect formation typically associated with early SiGe fin formation techniques.

Methodology in accordance with embodiments of the present disclosure includes forming a plurality of Si fins over a Si substrate. A gate dielectric layer is formed over the plurality of Si fins. A gate is formed over each Si fin of the plurality. A HM and spacer layer is formed over and on sidewalls of each gate. A u-shaped cavity is formed in Si fins of the plurality adjacent to the gate and spacer layer. An un-doped high percentage SiGe layer is epitaxially grown in each u-shaped cavity and along sidewalls of each Si fin. The un-doped high percentage SiGe layer is thermally condensed, forming an un-doped low percentage SiGe underneath in the substrate and in Si fins and a S/D region is formed over the un-doped high percentage SiGe layer in each u-shaped cavity, an upper surface of the S/D regions below the gate dielectric layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1 through 5 schematically illustrate cross-sectional views of a process flow for forming a FinFET device having a graded SiGe percentage PFET channel, in accordance with an exemplary embodiment. Adverting to FIG. 1, Si fins 101 are formed, e.g., to a height of 100 nm to 200 nm with an active portion of 30 nm to 50 nm and a width of 5 nm to 12 nm, over a PFET region of a Si substrate 103. A gate dielectric layer 105 is then formed, e.g., to a thickness of 10 angstrom (Å) to 30 Å, over the Si fins 101. The gate dielectric layer 105 may be formed, e.g., of silicon dioxide ($SiO_2$), and the $SiO_2$ may be replaced by a high-k gate dielectric, e.g., $HfO_2$, during subsequent processing (not shown for illustrative convenience). Next, gate 107 are formed, e.g., of polysilicon, over the gate dielectric layer 105. The polysilicon may later be replaced by a metal stack including TiN and tungsten (W) during a subsequent replacement metal gate (RMG) processing (not shown for illustrative convenience). Subsequently, a HM and spacer layer is formed, e.g., of SiN, over and on sidewalls of each gate 107, forming low-K spacers 109a and HM 109b. The low-K spacers 109a and HM 109b prevent epitaxial growth on the gate 107 and the low-k material protects complementary devices (i.e. NFETs) from epitaxial growth. The Si fins 101 and Si substrate 103 are then etched, e.g., by dry etching, to form u-shaped cavity 113 having a depth, e.g., of 40 nm to 50 nm, adjacent to the gate 107 and low-K spacers 109a.

Figure 1:
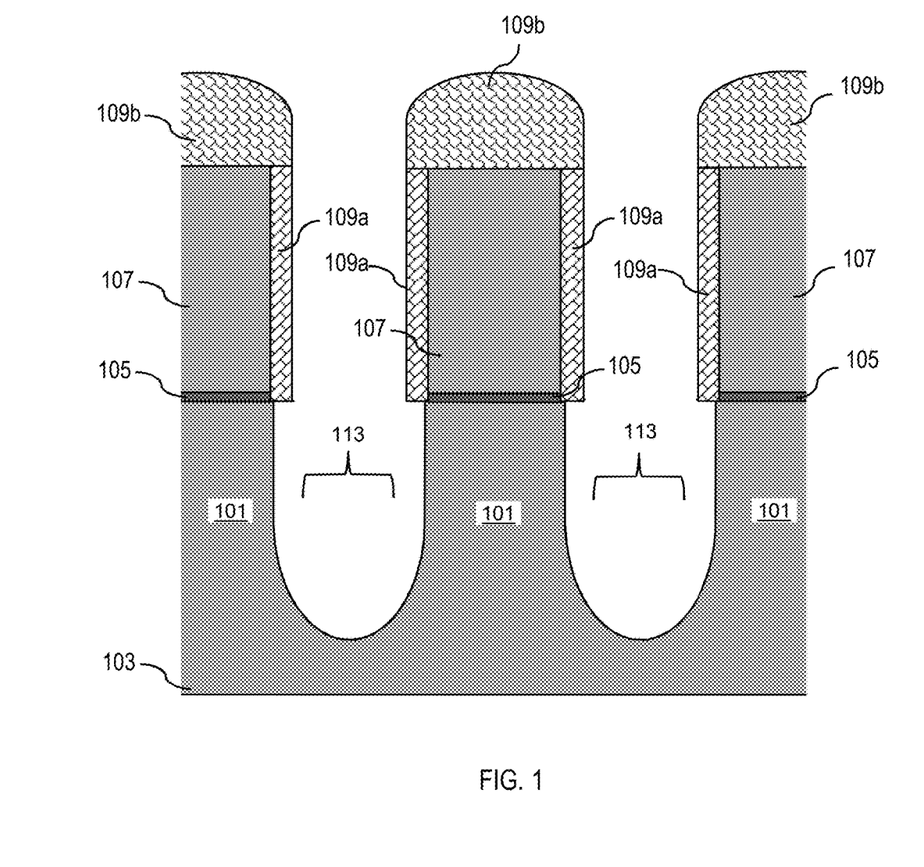
FIGS. 1 through 5 schematically illustrate cross-sectional views of a process flow for forming a FinFET device having a graded SiGe percentage PFET channel, in accordance with an exemplary embodiment.
Figure 2:
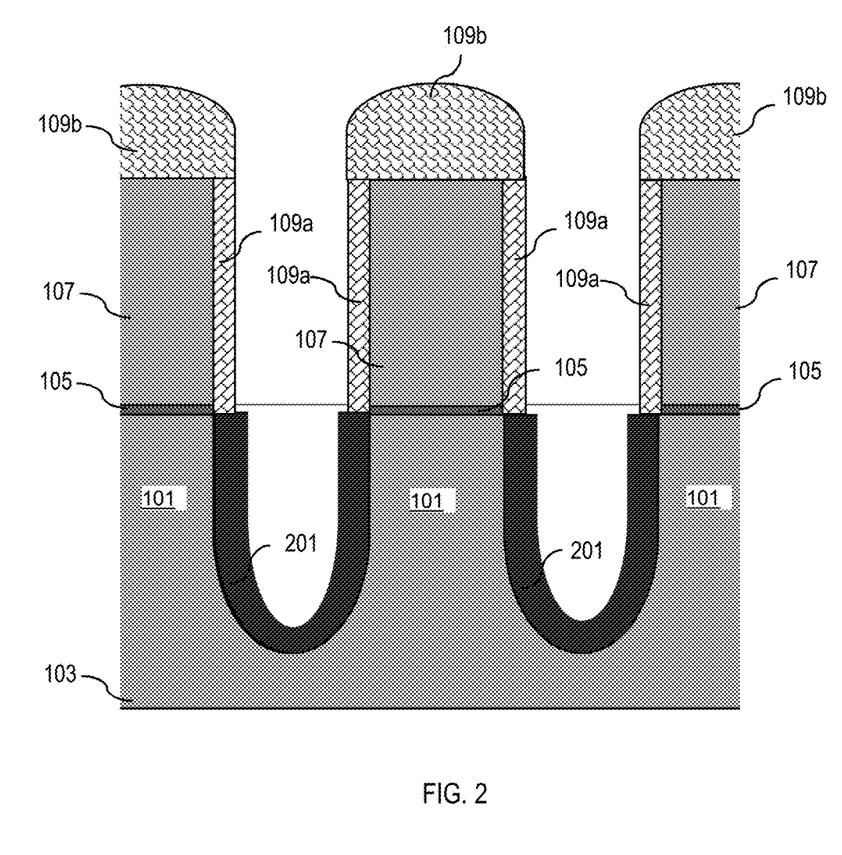
Figure 3:
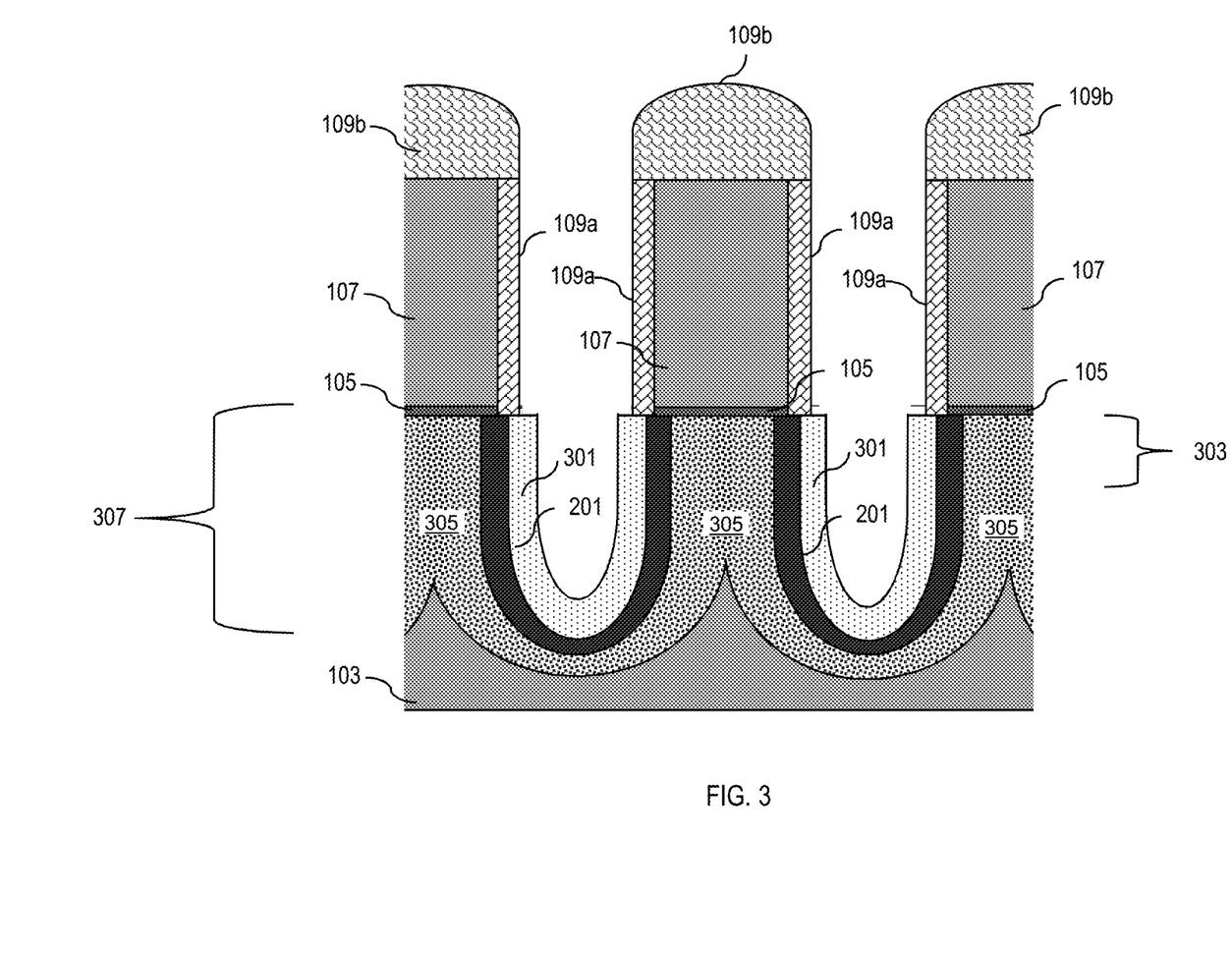

Next, a high percentage un-doped SiGe layer 201, for example, having 20 to 100 percent Ge, e.g., 20 to 50 percent, is epitaxially grown on the sidewalls of the Si fins 101 and over the u-shaped cavity 113, as depicted in FIG. 2. Adverting to FIG. 3, the SiGe layer 201 is thermally condensed forming an oxide layer 301, e.g., to a thickness of 10 nm to 25 nm, over the SiGe layer 201, and pushing Ge into the channel region 303 under each gate 107 and dielectric layer 105. Consequently, an un-doped low percentage SiGe layer 305 is formed, e.g., having 5 to 20 percent Ge, between the un-doped high percentage SiGe layer 201 and gate dielectric layer 105 and the substrate 103, forming SiGe fins 307 and a graded SiGe percentage and PFET channel 303 (SiGe layers 201 and 305). The un-doped low percentage SiGe layer 305 may fully extend beneath the channel region, e.g., of 14 nm to 20 nm, of a short channel device, and partially extend beneath a channel region, e.g., of 30 nm or more, of a long channel device.

Figure 4:
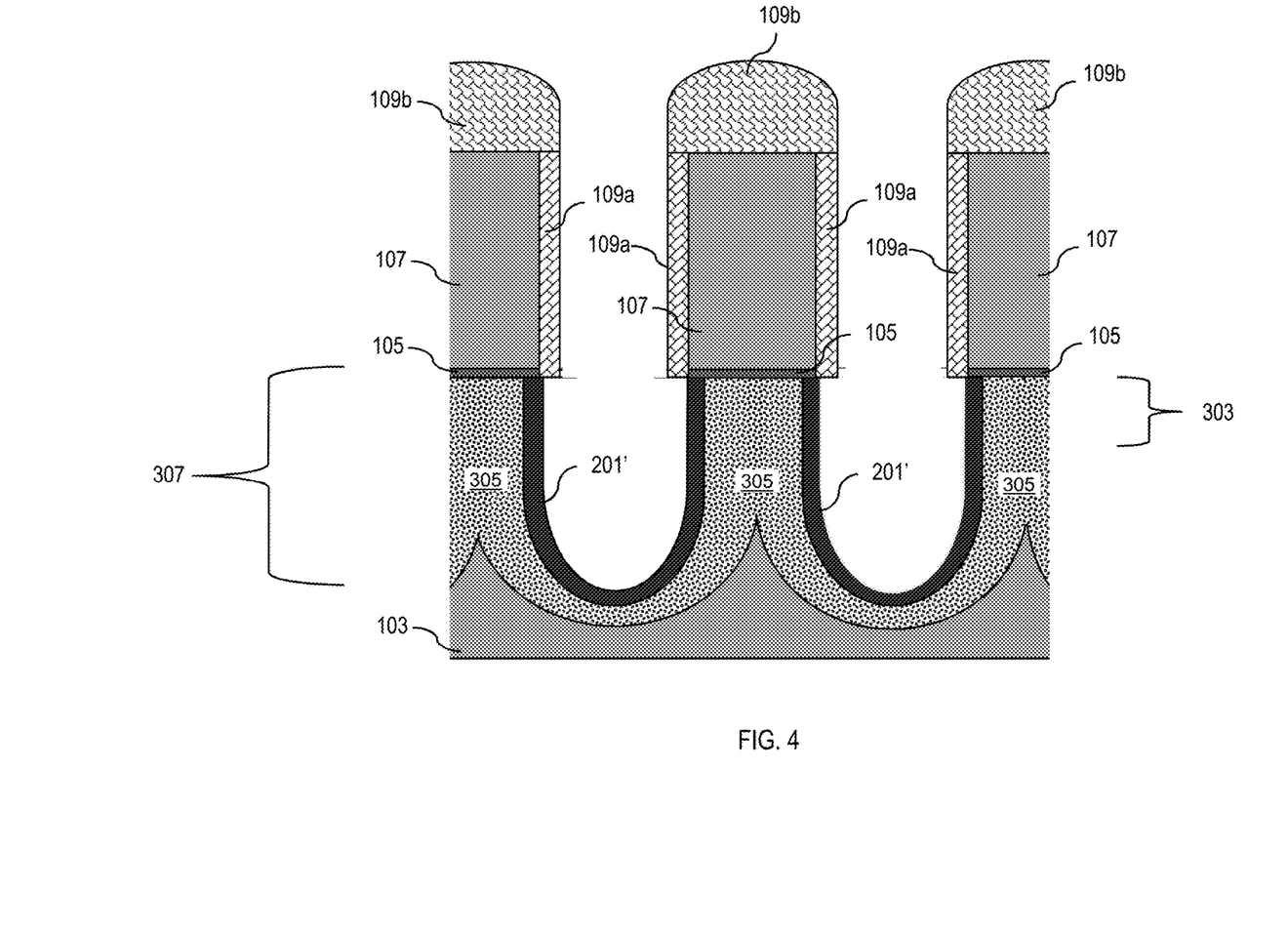
Figure 5:
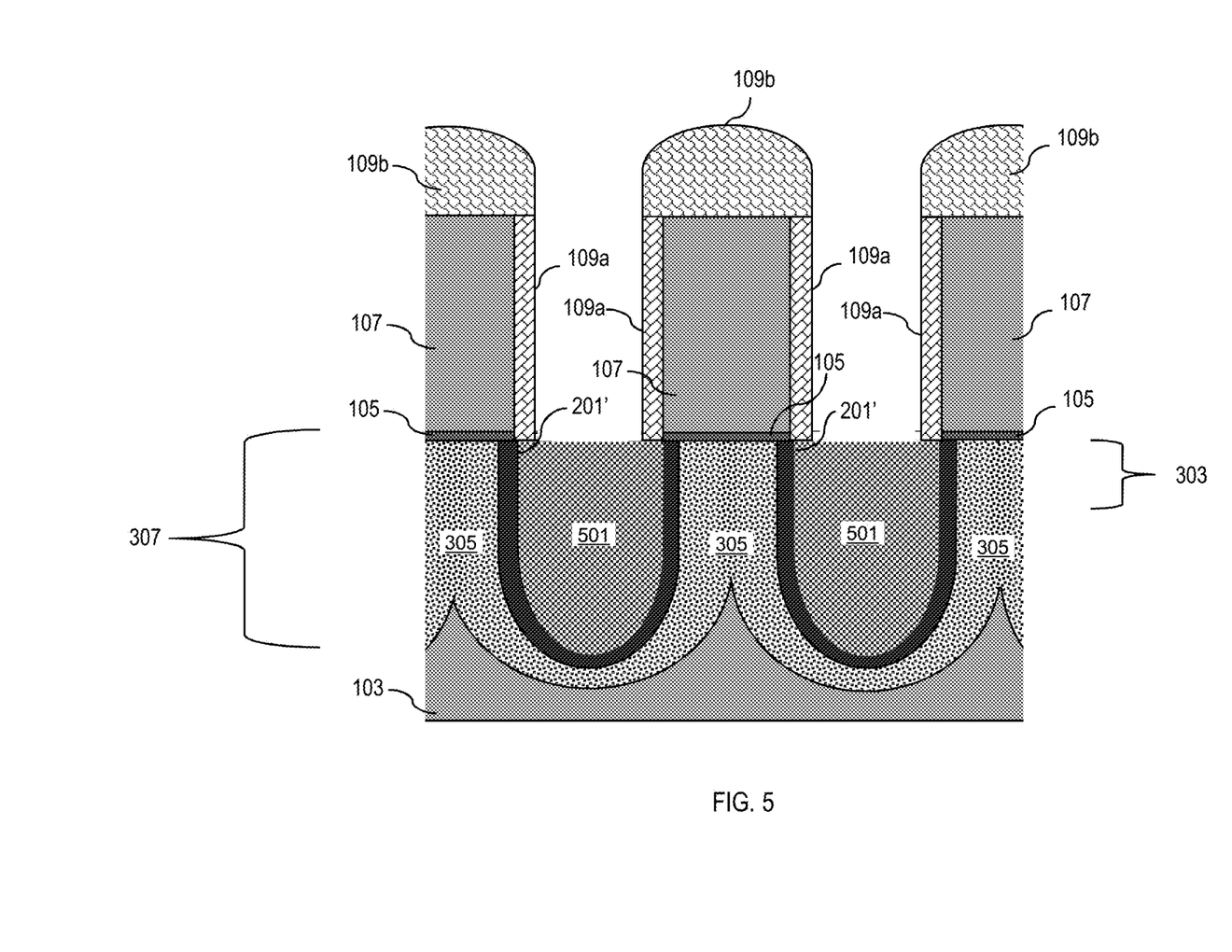

Adverting to FIG. 4, the oxide layer 301 is removed and the SiGe layer 201 is consequently thinned, e.g., to a thickness of 4.5 nm to 20 nm, forming SiGe layer 201'. Next, S/D regions 501 are formed, e.g., of B doped SiGe, in each u-shaped cavity 113 over the un-doped high percentage SiGe layer 201' and along the sidewalls of the SiGe fins 307, up to the gate dielectric layer 105, as depicted in FIG. 5. Consequently, the thermal oxidation results in a lower percentage of Ge in the SiGe layer 305 and a higher percentage of Ge at the boundary between the SiGe layer 305 and the subsequently formed S/D regions.

Figure 6:
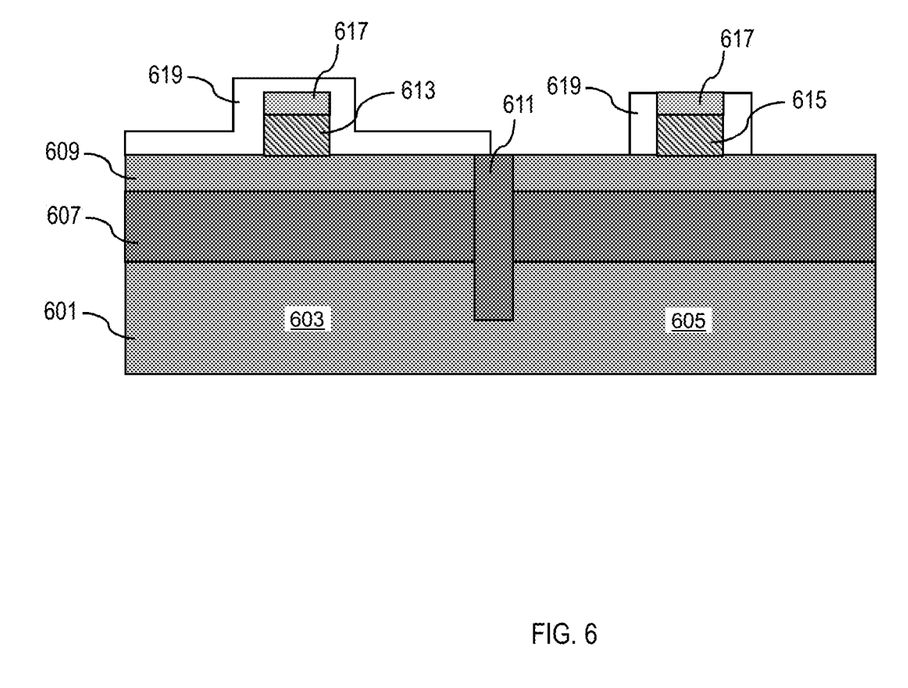
FIGS. 6 through 8 schematically illustrate cross-sectional views of a process flow for forming an FDSOI device having a graded SiGe percentage PFET channel, in accordance with an exemplary embodiment.
Figure 7:
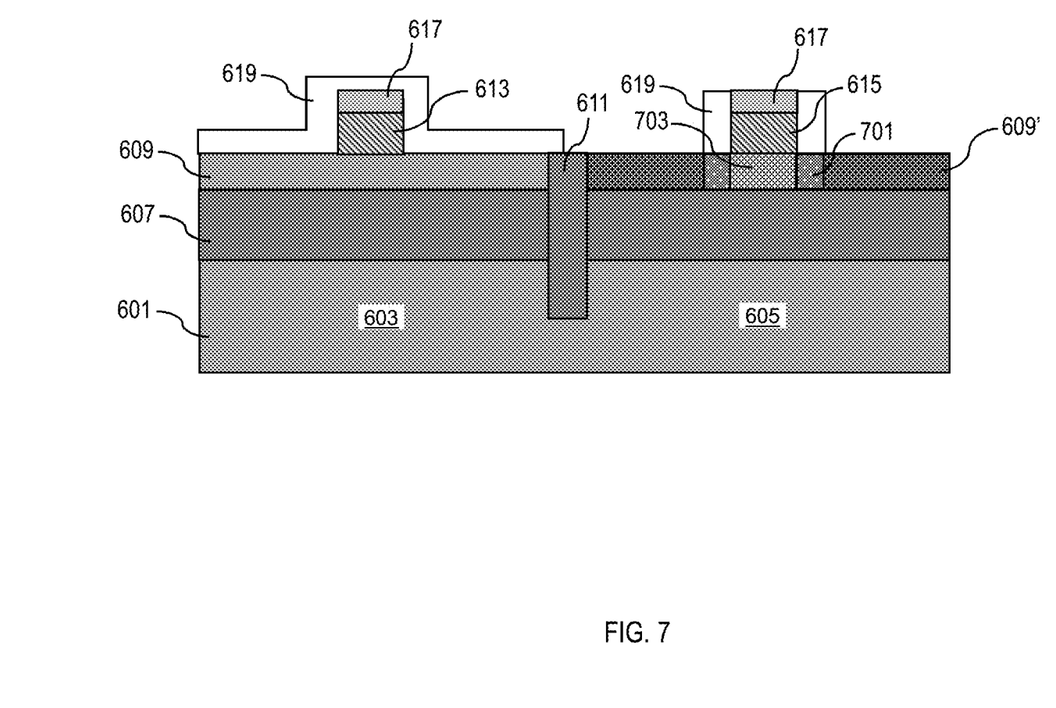
Figure 8:
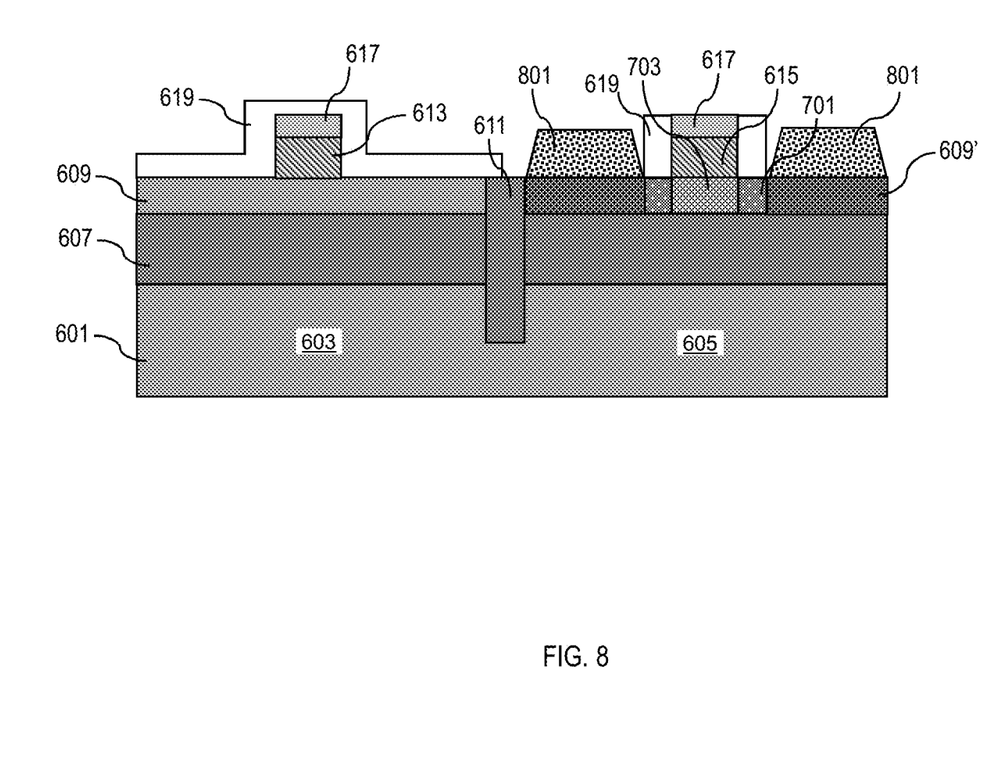

FIGS. 6 through 8 schematically illustrate cross-sectional views of a process flow for forming an FDSOI device having a graded SiGe percentage PFET channel, in accordance with an exemplary embodiment. Adverting to FIG. 6, a Si substrate 601 is formed having an NFET region 603 and a PFET region 605. A BOX layer 607 is formed, e.g., to a thickness of 10 nm to 25 nm, over the Si substrate 601. Then, a Si SOI layer 609 is formed, e.g., to a thickness of 5 nm to 10 nm, over the BOX layer 607. Next, a STI pillar 611 is formed, e.g., to a depth of 10 nm to 150 nm, through the Si SOI layer 609 and BOX layer 607, and a portion of the Si substrate 601 between the NFET and PFET regions 603 and 605, respectively. Subsequently, gate stacks 613 and 615 are formed, e.g., by gate patterning, over portions of the Si SOI layer 609 over the NFET 603 and PFET 605 regions. The gate stack 613 includes a HfO$_2$ dielectric layer (not shown for illustrative convenience) formed, e.g., to a thickness of approximately 15 Å, over portions of the Si SOI layer 609; a TiN WF metal layer (not shown for illustrative convenience) formed, e.g., to a thickness of approximately 10 nm, over the HfO$_2$ dielectric layer; and a polysilicon layer (not shown for illustrative convenience) formed, e.g., to a thickness of 20 nm to 50 nm, over the TiN WF metal layer.

Next, a HM layer 617 is formed, e.g., of silicon nitride (SiN) and to a thickness of 10 nm to 30 nm, over each gate stack 613. Thereafter, a HM layer is conformally formed, e.g., of nitride and to a thickness of 3 nm to 15 nm, over the substrate 601 and then etched back, forming the HM layer 619 over the NFET region 603 and a portion of the STI pillar 611 and along the sidewalls of the gate stack 615 and HM layer 617 over the PFET region 605.

Adverting to FIG. 7, an un-doped high percentage SiGe layer (not shown for illustrative convenience) is epitaxially grown, e.g., to a thickness of 20 nm to 30 nm, over the Si SOI layer 609 over PFET region 605. Similar to the process steps described with respect to FIG. 3 above, the un-doped high percentage SiGe is thermally condensed resulting in an oxide layer (not shown for illustrative convenience) and Ge is pushed into the Si SOI layer 609 and channel region under the gate stack 615, forming the Si SOI layer 609', un-doped high percentage SiGe layer 701, e.g., having 20 to 50 percent Ge, and an un-doped low percentage SiGe layer 703, e.g., having 5 to 20 percent Ge (i.e., forming a graded SiGe percentage PFET channel). Next, the oxide layer is removed.

As illustrated in FIG. 8, defect free B doped S/D regions 801 are epitaxially grown over the Si SOI layer 609'. As a result, similar to FIG. 5, the channel region under the gate stack 615 has a lower percentage of Ge and the boundary between the channel region and the S/D regions 801 has a high percentage of Ge, i.e., an ultra-steep junction is formed with higher Ge percentage at the channel/S/D boundary.

The embodiments of the present disclosure can achieve several technical effects including avoiding known SiGe fin integration limitations (low temperature STI and crystalline defects, steeper junction from high Ge percentage, and high stress expected from thermally condensed Ge. Further, with respect to FDSOI devices the technical effects include enabling better avoidance of agglomeration defects on ultra-thin SOI channels, enabling ultra-steep junctions, and enabling V$_t$ shift in SRAM devices having tight NFET/PFET spaces. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of FinFET or FDSOI devices, particularly for the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
  forming a plurality of silicon (Si) fins over a Si substrate;
  forming a gate dielectric layer over the plurality of Si fins;
  forming a gate over each Si fin of the plurality;
  forming a hard mask (HM) and spacer layer over and on sidewalls of each gate;
  forming a u-shaped cavity in Si fins of the plurality adjacent to the gate and spacer layer;
  epitaxially growing an un-doped high percentage silicon germanium (SiGe) layer in each u-shaped cavity and along sidewalls of each Si fin;
  thermally condensing the un-doped high percentage SiGe layer, an un-doped low percentage SiGe formed underneath in the substrate and Si fins; and
  forming a source/drain (S/D) region over the un-doped high percentage SiGe layer in each u-shaped cavity, an upper surface of the S/D regions below the gate dielectric layer.

2. The method according to claim 1, wherein the un-doped high percentage SiGe layer comprises 20 to 50 percent germanium (Ge).

3. The method according to claim 1, wherein the un-doped low percentage SiGe layer comprises 5 to 20 percent Ge.

4. The method according to claim 1, further comprising removing an oxide layer formed by the thermally condensing of the un-doped high percentage SiGe layer.

5. The method according to claim 1, comprising forming the S/D region of boron (B) doped SiGe.

* * * * *